United States Patent
Tanaka et al.

(10) Patent No.: US 6,563,396 B2
(45) Date of Patent: *May 13, 2003

(54) COMPOSITE HIGH FREQUENCY COMPONENT AND MOBILE COMMUNICATION APPARATUS INCORPORATING THE SAME

(75) Inventors: Koji Tanaka, Shiga-ken (JP); Koji Furutani, Okayama (JP); Takahiro Watanabe, Shiga-ken (JP); Hideki Muto, Takefu (JP); Takanori Uejima, Okayama-ken (JP); Norio Nakajima, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/176,124

(22) Filed: Jun. 19, 2002

(65) Prior Publication Data

US 2002/0153966 A1 Oct. 24, 2002

Related U.S. Application Data

(62) Division of application No. 09/672,715, filed on Sep. 28, 2000, now Pat. No. 6,445,262.

(30) Foreign Application Priority Data

Sep. 28, 1999 (JP) ............................................ 11-274828

(51) Int. Cl.[7] .......................... H03H 9/76; H03H 9/72; H01P 1/213
(52) U.S. Cl. ...................... 333/133; 333/185; 333/101; 333/193; 455/83; 455/552
(58) Field of Search ................................ 333/133, 185, 333/101, 193–196; 455/83, 552

(56) References Cited

U.S. PATENT DOCUMENTS

| | | | | |
|---|---|---|---|---|
| 4,980,660 A | * | 12/1990 | Nakamura et al. | 333/101 |
| 5,815,052 A | * | 9/1998 | Nakajima et al. | 333/175 |
| 5,815,804 A | * | 9/1998 | Newell et al. | 455/78 |
| 6,025,761 A | * | 2/2000 | Watanabe et al. | 333/133 |
| 6,222,426 B1 | * | 4/2001 | Komazaki et al. | 333/133 |
| 6,249,194 B1 | * | 6/2001 | Watanabe et al. | 333/133 |
| 6,249,687 B1 | * | 6/2001 | Thomsen et al. | 455/553 |
| 6,445,262 B1 | * | 9/2002 | Tanaka et al. | 333/133 |

FOREIGN PATENT DOCUMENTS

| | | | |
|---|---|---|---|
| EP | 1014592 A2 | * | 6/2000 |
| EP | 1 223 634 A2 | * | 7/2002 |
| JP | 07-202503 | | 8/1995 |
| JP | 09-260901 | | 10/1997 |
| JP | 10-032521 | * | 2/1998 |
| JP | 11-127052 | * | 5/1999 |
| JP | 11-145771 | * | 5/1999 |
| JP | 11-154804 | * | 6/1999 |
| JP | 11-168303 | * | 6/1999 |
| JP | 2000-188522 | * | 7/2000 |

* cited by examiner

Primary Examiner—Barbara Summons
(74) Attorney, Agent, or Firm—Keating & Bennett, LLP

(57) ABSTRACT

A composite high frequency component and a mobile communication apparatus incorporating the same which needs no matching circuits and can easily be miniaturized. The composite high frequency component is constituted of a diplexer, high frequency switches, high frequency filters, and surface acoustic wave filters. The diplexer is formed by first inductors and first capacitors. The high frequency switches are formed by diodes, second inductors, and second capacitors. The high frequency filters are formed by third inductors and third capacitors.

20 Claims, 7 Drawing Sheets

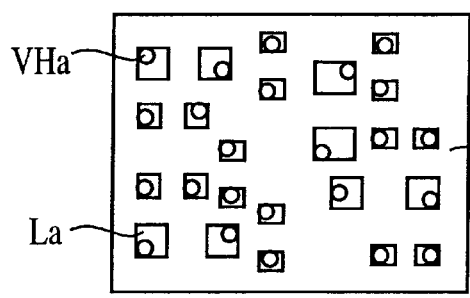 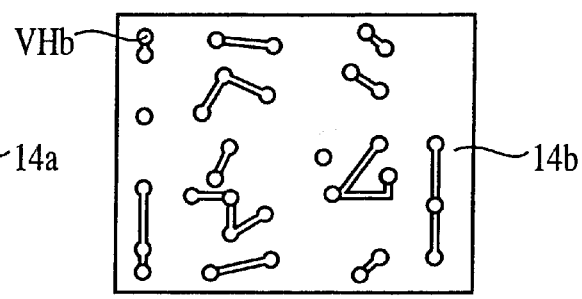
FIG. 6A  FIG. 6B
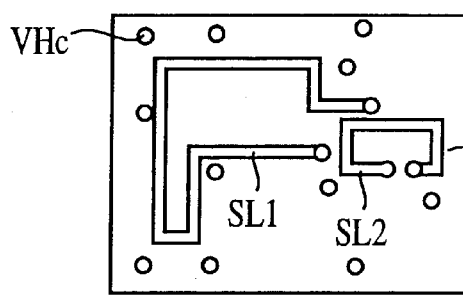 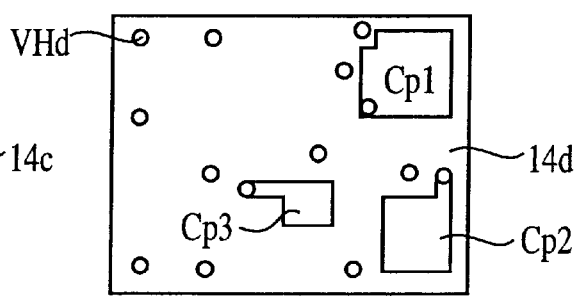
FIG. 6C  FIG. 6D
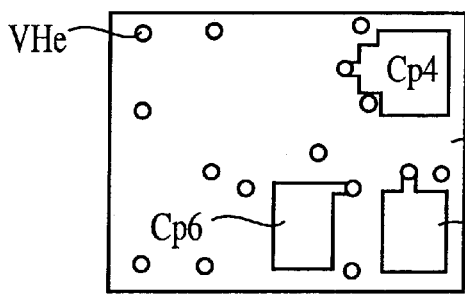 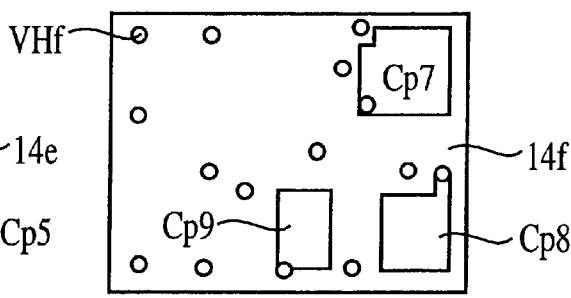
FIG. 6E  FIG. 6F
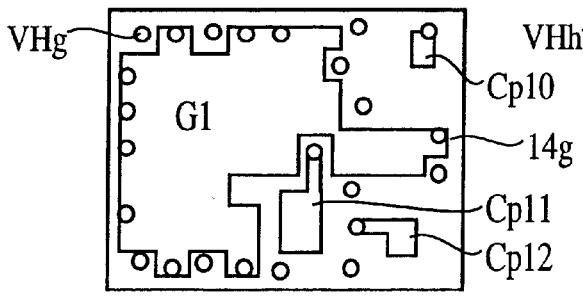 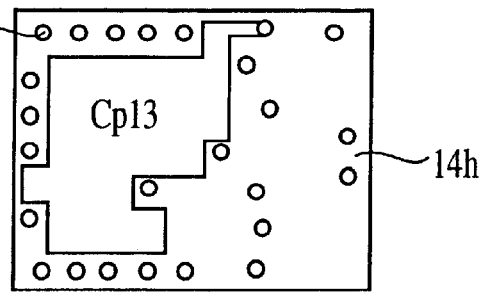
FIG. 6G  FIG. 6H

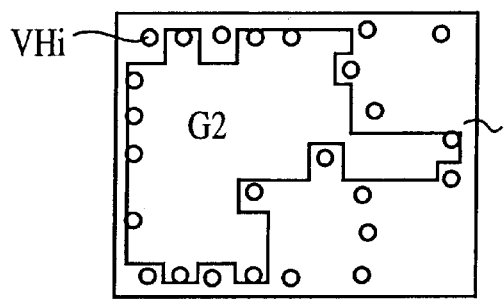
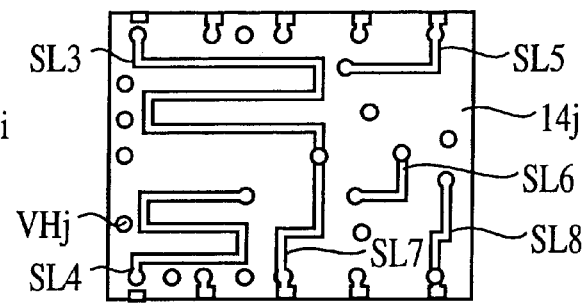
FIG. 7A                FIG. 7B
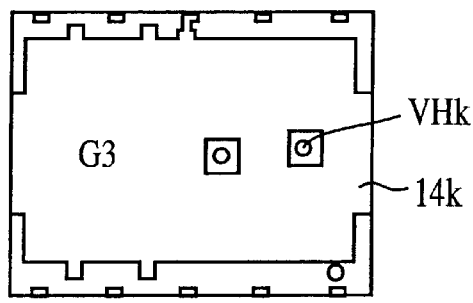
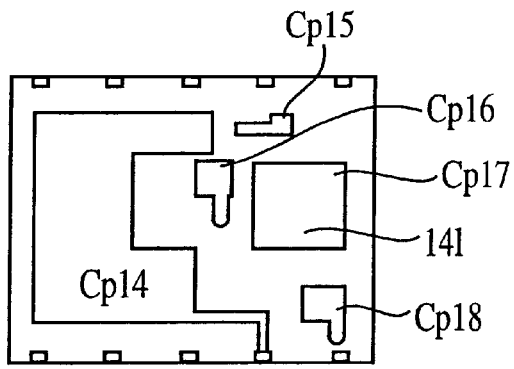
FIG. 7C                FIG. 7D
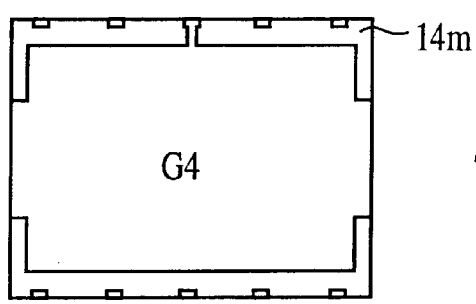
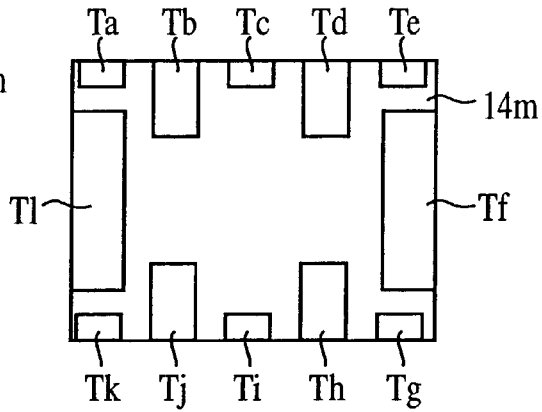
FIG. 7E                FIG. 7F

COMPOSITE HIGH FREQUENCY COMPONENT AND MOBILE COMMUNICATION APPARATUS INCORPORATING THE SAME

CROSS REFERENCE TO RELATED APPLICATIONS

This is a divisional of U.S. patent application Ser. No. 09/672,715, filed Sep. 28, 2000, now U.S. Pat. No. 6,445,262, in the name of Koji TANAKA, Koji FURUTANI, Takahiro WATANABE, Hideki MUTO, Takanori UEJIMA and Norio NAKAJIMA and entitled COMPOSITE HIGH FREQUENCY COMPONENT AND MOBILE COMMUNICATION APPARATUS INCORPORATING THE SAME.

BACKGROUND OF THE INVENTION

1. Field of the Invention

The present invention relates to composite high frequency components and mobile communication apparatuses incorporating the same. More particularly, the invention relates to composite high frequency components usable in a plurality of different mobile communication systems, and mobile communication apparatuses incorporating the same.

2. Description of the Related Art

Currently, in Europe, as mobile communication apparatuses, dual-band mobile telephones are provided. Such an apparatus can be operated in a plurality of communication systems using different frequency bands, for example, in a combination of the Digital Cellular System (DCS) using the 1.8 GHz band and the Global System for Mobile Communications (GSM) using 900 MHZ.

FIG. 10 shows a block diagram of a part of the structure of a conventional dual-band mobile telephone. It is an example in which the DCS using the 1.8 GHz band and the GSM using the 900 MHZ band are combined. The dual-band mobile telephone has an antenna 1, a diplexer 2, and two signal paths DCS and GSM.

The diplexer 2 selects signals transmitted from the DCS and the GSM at the time of transmission, and selects signals received in the DCS and the GSM at the time of reception. The DCS side is constituted of a high frequency switch 3a dividing the signal path into a transmission section Txd and a reception section Rxd, a high frequency filter 3b attenuating second-order harmonic signals and third-order harmonic signals on the DCS side, and a surface acoustic wave filter 3c preventing entering of the transmitted signals into the reception section Rxd. The GSM side is constituted of a high frequency switch 4a dividing the signal path into a transmission section Txg and a reception section Rxg, a high frequency filter 4b attenuating third-order harmonic signals on the GSM side, and a surface acoustic wave filter 4c preventing entering of the transmitted signals into the reception section Rxg.

Now, a description will be given of the operation of the dual-band mobile telephone by using the example of the DCS side. When a signal is transmitted, the high, frequency switch 3a makes a circuit to the transmission section Txd to send the signal transmitted from the transmission section Txd to the high frequency filter 3b. The diplexer 2 selects the signal passed through the high frequency filter 3b to transmit from the antenna 1. When a signal is received, the signal received in the antenna 1 is selected by the diplexer 2 to be sent to the high frequency filter 3b. The high frequency switch 3a makes a circuit to the reception section Rxd to send the signal passed through the high frequency filter 3b to the reception section Rxd via the surface acoustic wave filter 3c. In the GSM side, signals are also transmitted and received by the same operation.

However, in the conventional dual-band mobile telephone, the antenna, the diplexer, the high frequency switches in the DCS and the GSM sides, the high frequency filters, and the surface acoustic wave filters are independently mounted on a circuit board. As a result, in order to obtain matching characteristics, attenuation characteristics, and isolation characteristics, it is necessary to add matching circuits between the diplexer and the high frequency switches, between the high frequency switches and the high frequency filters, and between the high frequency switches and the surface acoustic wave filters, respectively. Thus, since the number of components and the area required for disposing the components are increased, the size of the circuit board is also increased. This leads to an increase in the size of the dual-band mobile telephone.

SUMMARY OF THE INVENTION

In order to solve the above problems, the present invention provides a composite high frequency component in which no matching circuits are necessary and a circuit board for mounting components can be miniaturized, and a mobile communication apparatus incorporating the same.

According to a first aspect of the present invention, there is provided a composite high frequency component included in a microwave circuit having a plurality of signal paths corresponding to respective frequencies. The composite high frequency component includes a diplexer which accepts signals transmitted from the corresponding plurality of single paths at a time of transmission, and delivers received signals to the plurality of signal paths at a time of reception; a plurality of high frequency switches dividing the plurality of signal paths into respective transmission sections and reception sections; a plurality of high frequency filters connected in respective signal paths; a plurality of surface acoustic wave filters connected to the reception-section sides at the rear of the corresponding plurality of high frequency switches; and a multi-layer substrate formed by laminating a plurality of ceramic sheet layers to integrate the diplexer, the high frequency switches, the high frequency filters, and the surface acoustic wave filters.

In addition, in the composite high frequency component, the plurality of high frequency filters may be connected to the transmission-section sides either at the front or at the rear of the corresponding plurality of high frequency switches.

In addition, in the composite high frequency component, the plurality of high frequency filters may be notch filters.

Furthermore, the above composite high frequency component may further include first inductance elements and first capacitance elements to form the diplexer; switching elements, second inductance elements, and second capacitance elements to form each of the plurality of high frequency switches; and a third inductance element and third capacitance elements to form each of the plurality of high frequency filters. In addition, the composite high frequency component may further include connecting sections formed inside the multi-layer substrate to connect the surface acoustic wave filters, the switching elements, the first to third inductance elements, and the first to third capacitance elements, some of which are contained in the multi-layer substrate and the remaining constituents are mounted thereon.

In this composite high frequency component, the surface acoustic wave filters may be mounted and sealed in a cavity formed inside the multi-layer substrate.

According to a second aspect of the present invention, there is provided a mobile communication apparatus including an antenna, a transmission section, a reception section, and the composite high frequency component described above.

In the above composite high frequency component, since the diplexer, the high frequency switches, the high frequency filters, and the surface acoustic wave filters constituting the composite high frequency component are integrated by the multi-layer substrate formed by laminating the plurality of ceramic sheet layers, connections between these constituents can be disposed inside the multi-layer substrate.

As a result, matching adjustments can be easily made, by techniques well known to those ordinarily skilled in the art, between the diplexer and the high frequency switches, between the high frequency switches and the high frequency filters, and between the high frequency switches and the surface acoustic wave filters. Thus, it is unnecessary to dispose matching circuits between the constituents.

Furthermore, since the mobile communication apparatus uses the composite high frequency component requiring no such matching circuits, the circuit board, on which the microwave circuit having the plurality of signal paths is formed, can be miniaturized.

Other features and advantages of the invention will be understood from the following description of embodiments thereof, with reference to the drawings in which like references denote like elements and parts.

BRIEF DESCRIPTION OF THE DRAWINGS

FIGS. 6A to 6H are top views of a first sheet layer to an eighth sheet layer;

FIGS. 7A to 7E are top views of a ninth sheet layer to a thirteenth sheet layer, and FIG. 7F is a bottom view of the thirteenth sheet layer;

DESCRIPTION OF EMBODIMENTS OF THE INVENTION

Figure 1:
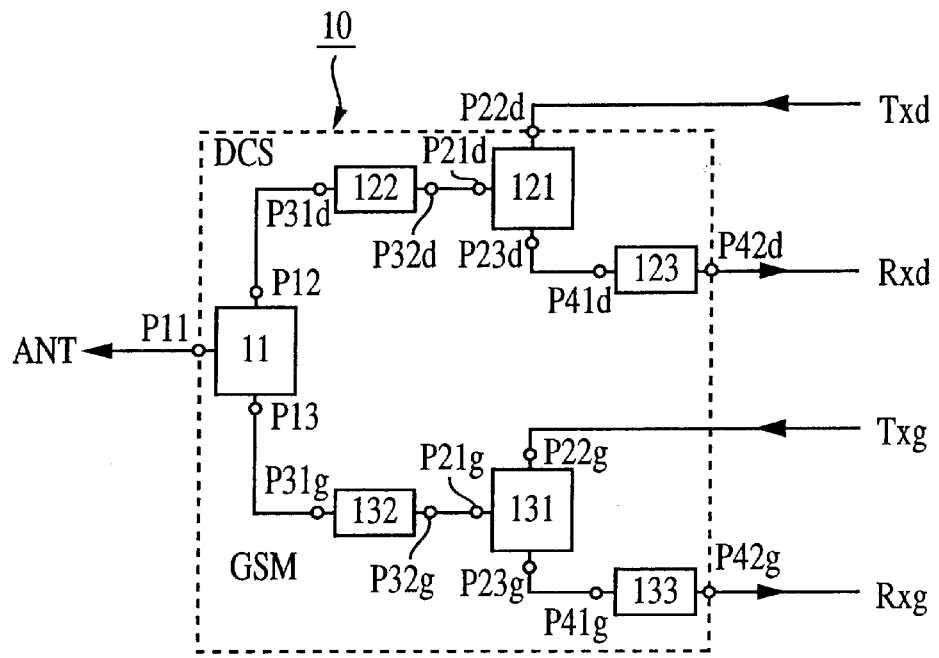
FIG. 1 is a block diagram of a composite high frequency component according to a first embodiment of the present invention.

Now, referring to the drawings, a description will be given of the embodiments of the present invention.

FIG. 1 shows a block diagram of a composite high frequency component according to a first embodiment of the present invention. A composite high frequency component 10 is constituted of a diplexer 11, a high frequency switch 121, a high frequency filter 122, and a surface acoustic wave filter 123, which form a DCS circuit (hereinafter "DCS"), and a high frequency switch 131, a high frequency filter 132, and a surface acoustic wave filter 133, which form a GSM circuit (hereinafter "GSM"). An area surrounded by dotted lines indicates a multi-layer substrate (not shown), in which the above constituents are integrated.

An antenna ANT is connected to a first port P11 of the diplexer 11. A first port P31$d$ of the high frequency filter 122 of the DCS is connected to a second port P12 of the diplexer 11. A first port P31$g$ of the high frequency filter 132 of the GSM is connected to a third port P13 of the diplexer 11.

In addition, on the DCS side, a first port P21$d$ of the high frequency switch 121 is connected to a second port P32$d$ of the high frequency filter 122. A transmission section Txd is connected to a second port P22$d$ of the high frequency switch 121. Furthermore, a first port P41$d$ of the surface acoustic wave filter 123 is connected to a third port P23$d$ of the high frequency switch 121. A reception section Rxd is connected to a second port P42$d$ of the surface acoustic wave filter 123.

On the GSM side, a first port P21$g$ of the high frequency switch 131 is connected to a second port P32$g$ of the high frequency filter 132, and a transmission section Txg is connected to a second port P22$g$ of the high frequency switch 131. Moreover, a first port P41$g$ of the surface acoustic wave filter 133 is connected to a third port P23$g$ of the high frequency switch 131, and a reception section Rxg is connected to a second port P42$g$ of the surface acoustic wave filter 133.

Figure 2:
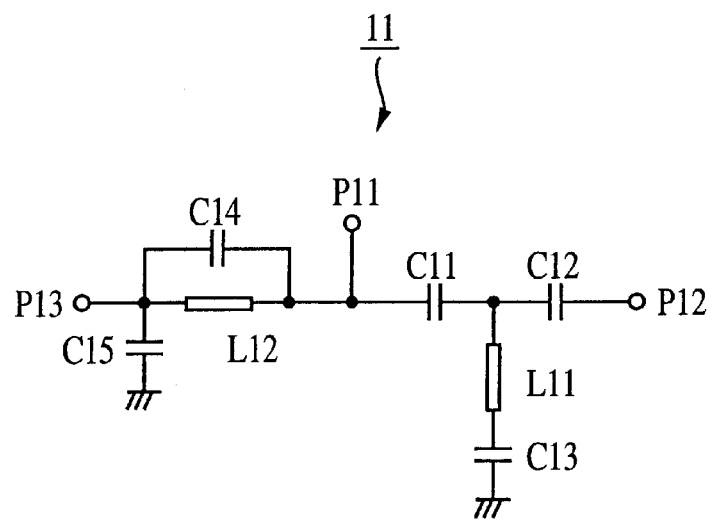
FIG. 2 is a circuit diagram of a diplexer constituting the composite high frequency component shown in FIG. 1.

FIG. 2 is a circuit diagram of the diplexer 11 constituting the composite high frequency component shown in FIG. 1. The diplexer 11 is constituted of first inductors L11 and L12 as first inductance elements, and first capacitors C11 to C15 as first capacitance elements.

Between the first port P11 and the second port P12 of the diplexer 11, first capacitors C11 and C12 are connected in series. The junction of the capacitors C11 and C12 is grounded via the first inductor L11 and the first capacitor C13.

Between the first port P11 and the third port P13, a parallel circuit constituted of the first inductor L12 and the first capacitor C14 is connected, and the third port P13 of the parallel circuit is grounded via the first capacitor C15.

A high pass filter is formed between the first port P11 and the second port P12, and a notch filter (a band elimination filter) is formed between the first port P11 and the third port P13.

Figure 3A:
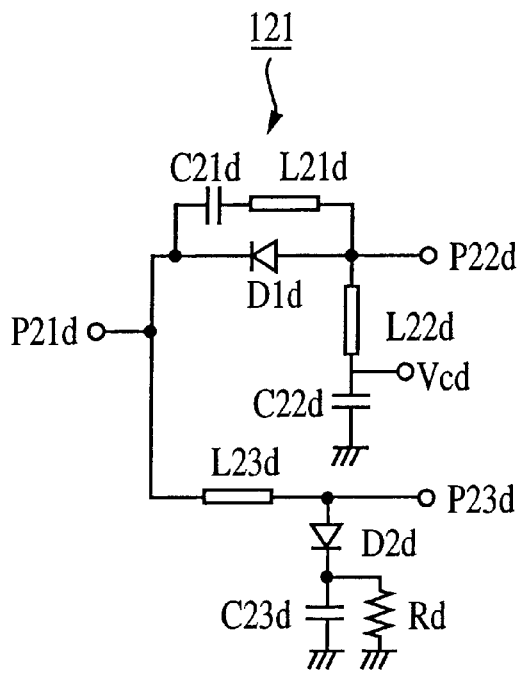
FIGS. 3A and 3B show circuit diagrams of high frequency switches constituting the high frequency component shown in FIG. 1.
Figure 3B:
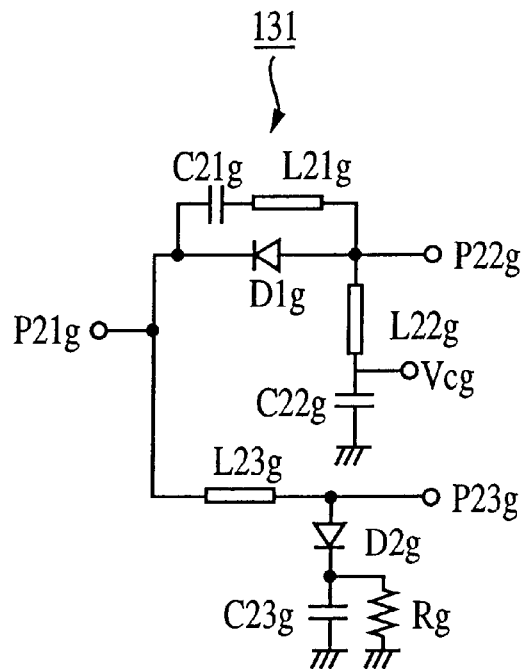

FIGS. 3A and 3B show circuit diagrams of the high frequency switches 121 and 131 constituting the composite high frequency component shown in FIG. 1. FIG. 3A shows the circuit diagram of the high frequency switch 121 of the DCS side, and FIG. 3B shows the circuit diagram of the high frequency switch 131 of the GSM side. The high frequency switches 121 and 131 have the same circuit structures. Thus, only the high frequency switch 121 will be described in the following description, which will also give the reference numbers of the corresponding structural parts of the high frequency switch 131.

The high frequency switch 121 (131) is constituted of diodes D1$d$ (D1$g$) and D2$d$ (D2$g$) as switching elements, second inductors L21$d$ to L23$d$ (L21$g$ to L23$g$) as second inductance elements, and second capacitors C21$d$ to C23$d$ (C21$g$ to C23$g$) as second capacitance elements. The second inductor L21d (L21g) is a parallel trap coil, and the second inductor L22d (L22g) is a choke coil.

The diode D1d (D1g) is connected between the first port P21d (P21g) and the second port P22d (P22g) in such a manner that the cathode of the diode D1d (or D1g) is oriented toward the first port P21d (P21g). The diode D1d (D1g) is connected in parallel to a series circuit constituted of the second inductor L21d (L21g) and the capacitor C21d (C21g).

The anode of the diode D1d (D1g), which is oriented toward the second port P22d (P22g), is grounded via the second inductor L22d (L22g) and the second capacitor C22d (C22g). A control terminal Vcd (Vcg) is connected to the junction of the second inductor L22d (L22g) and the second capacitor C22d (C22g).

The second inductor L23d (L23g) is connected between the first port P21d (21g) and the third port P23d (P23g), and the third port P23d of the second inductor L23d (L23g) is grounded via the diode D2d (D2g) and the second capacitor C23d (C23g). The junction of the cathode of the diode D2d (D2g) and the second capacitor C23d (C23g) is grounded via a resistor Rd (Rg).

Figure 4A:
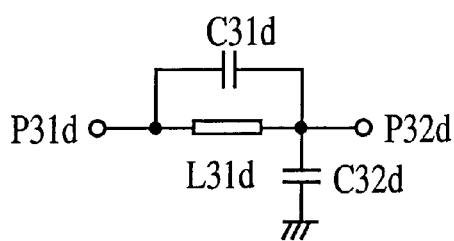
FIGS. 4A 4B show circuit diagrams of high frequency filters constituting the composite high frequency component shown in FIG. 1.
Figure 4B:
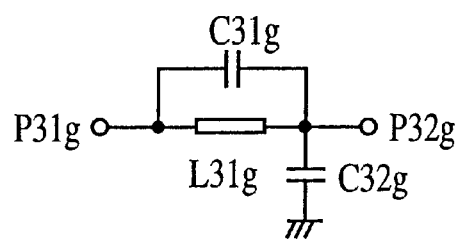

FIGS. 4A and 4B show circuit diagrams of the high frequency filters 122 and 132 constituting the composite high frequency component shown in FIG. 1. FIG. 4A shows the high frequency filter 122 on the DCS side, and FIG. 4B shows the high frequency filter 132 on the GSM side. Since the high frequency filters 122 and 132 have the same circuit structures, the high frequency filter 122 will be described, and only the reference numbers of the corresponding structural parts of the high frequency filter 132 will be given.

The high frequency filter 122 (132) is constituted of a third inductor L31d (L31g) as a third inductance element and third capacitors C31d to C32d (C31g and C32g) as third capacitance elements.

The third inductor L31d (L31g) is connected between the first port P31d (P31g) and the second port P32d (P32g), and the third capacitor C31d (C31g) is connected in parallel to the third inductor L31d (L31g).

The second port P32d (P32g) of the third inductor L31d (L31g) is grounded via the third capacitor C32d (C32g).

As described above, the high frequency filters 122 and 132 form notch filters by the third inductor L31d (L31g) and the third capacitors C31d and C32d (C31g and C32g).

Figure 5:
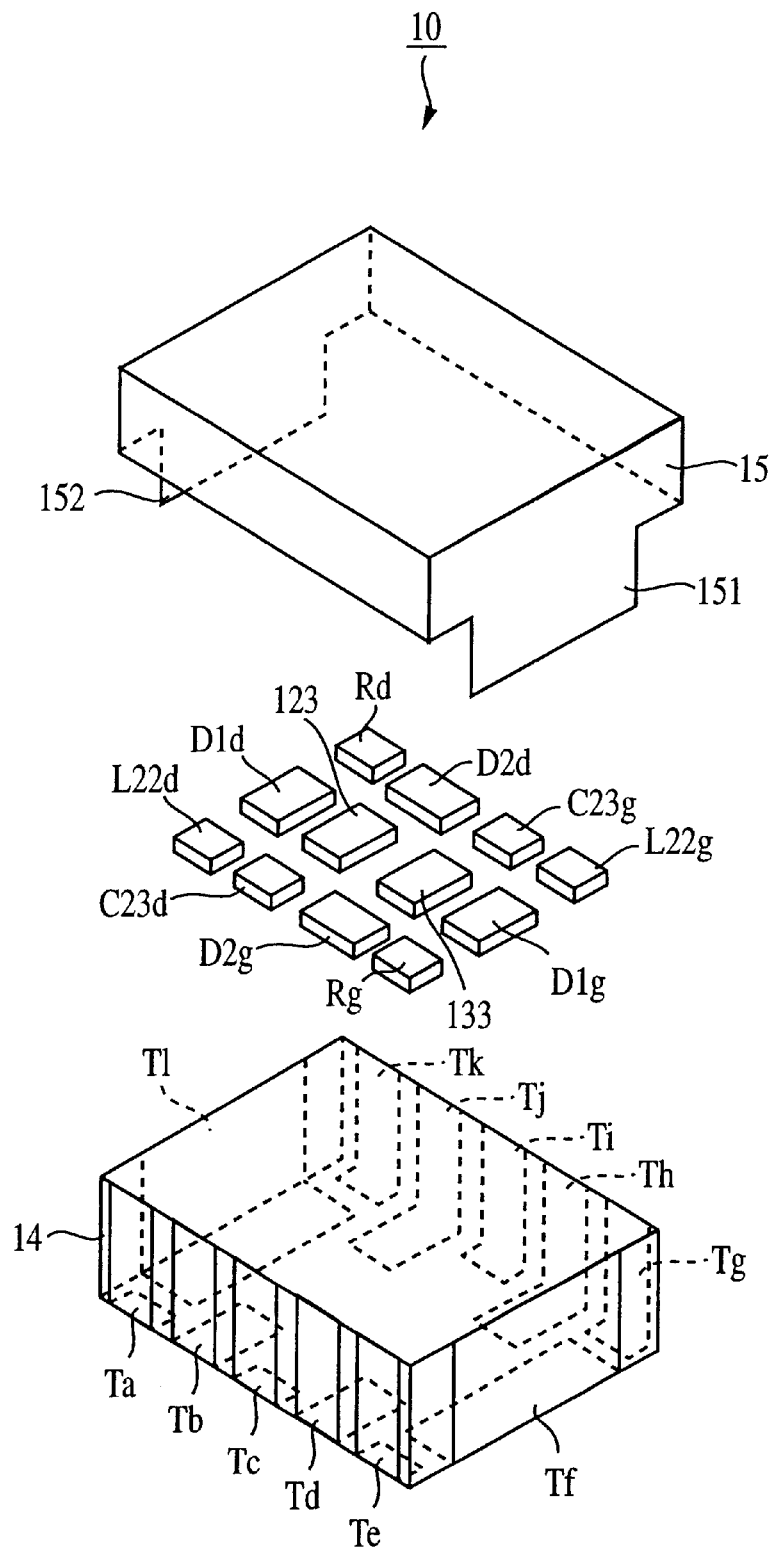
FIG. 5 is a partial exploded perspective view showing the detailed structure of the composite high frequency component shown in FIG. 1.

FIG. 5 is a partial exploded perspective view showing the detailed structure of the composite high frequency component 10 shown in FIG. 1. The composite high frequency component 10 includes a multi-layer substrate 14. In the multi-layer substrate 14 are contained first inductors L11 and L12 and first capacitors C11 to C15 constituting the diplexer 11 shown in FIG. 2, second inductors L21d, L23d, L21g, and L23g, and second capacitors C21d, C22d, C21g, and C22g constituting the high frequency switches 121 and 131shown in FIGS. 3A–3B, third inductors L31d and L31g, and third capacitors C31d, C32d, C31g, and C32g constituting the high frequency filters 122 and 132 shown in FIGS. 4A–4B, although the diplexer 11, the high frequency switches 121 and 131, and the high frequency filters 122 and 132 are not shown in FIG. 5.

On a surface of the multi-layer substrate 14 are mounted surface acoustic wave filters 123 and 133 in the form of chips, with the diodes D1d, D2d, D1g, and D2g, the second inductors (choke coils) L22d and L22g, the second capacitors C23d and C23g, and the resistors Rd and Rg constituting the high frequency switches 121 and 131 shown in FIGS. 3A and 3B.

In addition, from the side surfaces to the bottom surface of the multi-layer substrate 14, twelve external terminals Ta to Tl are formed by screen printing or the like. Among the external terminals Ta to Tl, the five external terminals Ta to Te are disposed on one longer side-surface of the multi-layer substrate 14, the five external terminals Tg to Tk are disposed on the other longer side-surface thereof. The remaining two external terminals Tf and Tl are disposed on the mutually opposing shorter side-surfaces thereof.

Then, a metal cap 15 is disposed to cover the multi-layer substrate 14 in such a manner that the constituents disposed on the substrate 14 are covered and protrusions 151 and 152 on the mutually opposing shorter side-surfaces abut with the external terminals Tf and Tl.

The external terminals Ta to Tl are used as the first port P11 of the diplexer 11, the second ports P22d and P22g of the high frequency switches 121 and 131, the control terminals Vcd and Vcg of the high frequency switches 121 and 131, the second ports P42d and P42g of the surface acoustic wave filters 123 and 133, and grounds.

Inside the multi-layer substrate 14, the second port P12 of the diplexer 11 is connected to the first port P31d of the high frequency filter 122, the second port P32d of the high frequency filter 122 is connected to the first port P21d of the high frequency switch 121, the third port P23d of the high frequency switch 121 is connected to the first port P41d of the surface acoustic wave filter 123, the third port P13 of the diplexer 11 is connected to the first port P31g of the high frequency filter 132, and the third port P23g of the high frequency switch 131 is connected to the first port P41g of the surface acoustic wave filter 133.

FIGS. 6A to 6H, and FIGS. 7A to 7F show the top views and bottom views of sheet layers forming the multi-layer substrate 14 of the composite high frequency component shown in FIG. 5. The multi-layer substrate 14 is formed by laminating first to thirteenth sheet layers 14a to 14m from above in sequence and then cofiring them at temperatures of equal to or less than 1000 degrees. Each of the sheet layers is formed of a ceramic material whose main components include barium oxide, aluminum oxide, and silica.

On the top surface of the first sheet layer 14a, a plurality of lands, indicated collectively by La in the figures, are printed by screen printing to be formed thereon. On the lands La are mounted the surface acoustic wave filters 123 and 133, the diodes D1d, D2d, D1g, and D2g, the second inductors L22d and L22g, the second capacitors C23d and C23g, and the resistors Rd and Rg disposed on the surface of the multi-layer substrate 14.

On the top surfaces of the third and tenth sheet layers 14c and 14j, stripline electrodes SL1 to SL8 formed of conductive layers are printed by screen printing to be formed thereon. In addition, on the top surfaces of the fourth to eighth sheet layers 14d to 14h and the twelfth sheet layer 14l, capacitor electrodes Cp1 to Cp18 formed of conductive layers are printed by screen printing to be formed thereon.

On the top surfaces of the seventh, ninth, eleventh, and thirteenth sheet layers 14g, 14i, 14k, and 14m, ground electrodes G1 to G4 formed of conductive layers are printed by screen printing to be formed thereon. Moreover, on the bottom surface of the thirteenth sheet layer 14m shown in FIG. 7f, the external termninals Ta to Tl are printed by screen printing to be formed thereon.

On specified positions of the first to eleventh sheet layers 14a to 14k, via-hole electrodes VHa to VHk for connecting the land La, the stripline electrodes SL1 to SL8, and the ground electrodes G1 to G4 are disposed.

In this case, the first inductors L11 and L12 of the diplexer 11 are formed by the stripline electrodes SL6 and SL7. The second inductors L21d and L23d of the high frequency switch 121 are formed by the stripline electrodes SL2 and SL4. The second inductors L21g and L23g of the high frequency switch 131 are formed by the stripline electrodes SL1 and SL3.

The third inductor L31d of the high frequency filter 122 is formed by the stripline electrode SL8. The third inductor L31g of the high frequency filter 132 is formed by the stripline electrode SL5.

The first capacitor C11 of the diplexer 11 is formed by the capacitor electrodes Cp6 and Cp9. The first capacitor C12 is formed by the capacitor electrodes Cp3 and Cp6. The first capacitor C13 is formed by the capacitor electrode Cp17 and the ground electrode G4. The first capacitor C14 is formed by the capacitor electrodes Cp9 and Cp11. The first capacitor C15 is formed by the capacitor electrode Cp16 and the ground electrode G4.

The second capacitor C21d of the high frequency switch 121 is formed by the capacitor electrodes Cp5 and Cp8. The second capacitor C22d thereof is formed by the capacitor electrode Cp13 and the ground electrode G2. The second capacitor C21g of the high frequency switch 131 is formed by the capacitor electrodes Cp4 and Cp7. The second capacitor C22g thereof is formed by the capacitor electrode Cp13 and the ground electrode G2.

The third capacitor C31d of the high frequency filter 122 is formed by the capacitor electrodes Cp8 and Cp12. The third capacitor C32d thereof is formed by the capacitor electrode Cp18 and the ground electrode G4. The third capacitor C31g of the high frequency filter 132 is formed by the capacitor electrodes Cp7 and Cp10. The third capacitor C32g thereof is formed by the capacitor electrode Cp15 and the ground electrode G4.

Now, a description will be given of the operation of the composite high frequency component 10 having the structure shown in FIG. 1. First, when a DCS signal (1.8 GHz band) is transmitted, the high frequency switch 121 on the DCS side applies 3V to the control terminal Vcd to turn on the diodes D1d and D2d. The transmitted signal on the DCS side passes through the high frequency switch 121, the high frequency filter 122, and the diplexer 11 to be transmitted from an antenna ANT connected to the first port P11 of the diplexer 11.

In this case, the high frequency switch 131 on the GSM side applies 0V to the control terminal Vcg to turn off the diode D1g so that a received GSM signal is not transmitted. In addition, with the diplexer 11 connected to the DCS side and the GSM side, the transmitted signal on the DCS side does not enter the transmission section Txg and reception section Rxg of the GSM side. The high frequency filter 122 of the DCS side attenuates the second-order and third-order harmonic signals on the DCS side.

Next, when a GSM signal (900 MHZ band) is transmitted, the high frequency switch 131 on the GSM side applies 3V to the control terminal Vcg to turn on the diodes D1g and D2g so that the transmitted GSM signal passes through the high frequency switch 131, the high frequency filter 132, and the diplexer 11. The passed signal is transmitted from the antenna ANT connected to the first port P11 of the diplexer 11.

In this situation, the high frequency switch 121 on the DCS side applies 0V to the control terminal Vcd to turn off the diode D1d so that DCS signals are not transmitted. In addition, with the diplexer 11 connected to the DCS side and the GSM side, transmitted GSM signals do not enter the transmission section Txd and reception section Rxd on the DCS side. The high frequency filter 132 on the GSM side attenuates the third-order harmonic signals on the GSM side.

When both DCS and GSM signals are received, the high frequency switch 121 on the DCS side applies 0V to the control terminal Vcd to turn off the diodes D1d and D2d, and the high frequency switch 131 on the GSM side applies 0V to the control terminal Vcg to turn off the diodes D1g and D2g, whereby the received DCS signals do not enter the transmission section Txd of the DCS, and the received GSM signals do not enter the transmission section Txg of the GSM.

In addition, with the diplexer 11 connected to the DCS and GSM sides, the received signals on the DCS side do not go to the GSM side, and the received signals on the GSM side do not go to the DCS side.

Figure 8:
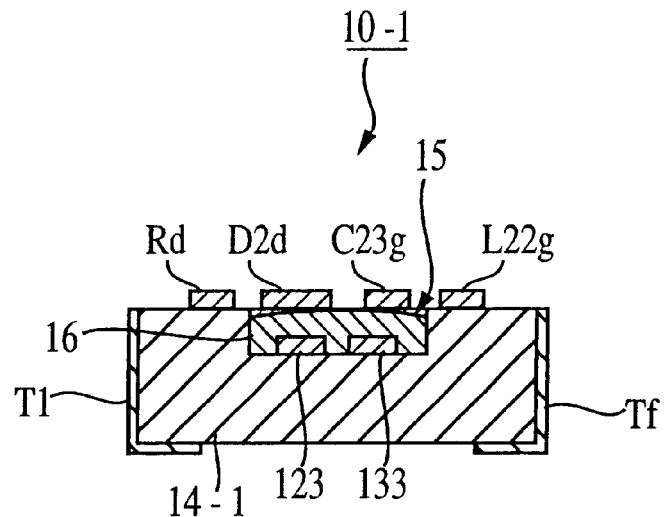
FIG. 8 is a sectional view of a modified example of the composite high frequency component shown in FIG. 5.

FIG. 8 is a sectional view of a modified example of the composite high frequency component 10 shown in FIG. 5. In a composite high frequency component 10-1, unlike the composite high frequency component 10 of the first embodiment shown in FIG. 5, surface acoustic wave filters 123 and 133 are mounted in a cavity 15 formed inside a multi-layer substrate 14-1.

When the multi-layer substrate 14-1 is formed, the cavity 15 is formed by laminating a sheet layer (not shown) having an opening in a position for forming the cavity 15 at the top. The cavity 15 is sealed by filling resin 16 therein after the surface acoustic wave filters 123 and 133 are mounted therein.

In the composite high frequency component of the first embodiment, the diplexer, the high frequency switches, the high frequency filters, and the surface acoustic wave filters constituting the composite high frequency component are integrated in the multi-layer substrate formed by laminating the plurality of ceramic sheet layers. As a result, connections between the diplexer, the high frequency switches, the high frequency filters, and the surface acoustic wave filters can be established inside the multi-layer substrate.

With this arrangement, matching adjustments can be easily made, by techniques well known to those ordinarily skilled in the art, between the diplexer and the high frequency switches, between the high frequency switches and the high frequency filters, and between the high frequency switches and the surface acoustic wave filters. Thus, no matching circuits for making the matching adjustments between the above constituents are necessary.

Therefore, the composite high frequency component can be miniaturized. For example, the composite high frequency component with a metal cap can be miniaturized so as to have dimensions of 6.7 mm×5.0 mm×2.0 mm.

Furthermore, since the high frequency filters are notch filters, it is possible to attenuate only the signals of frequencies close to the second-order and third-order harmonics, which are desired to be attenuated. As a result, influence on the pass band of a fundamental frequency can be reduced. Therefore, as compared with cases in which the overall harmonic frequency band is attenuated, as in low pass filters and band pass filters, insertion losses in the pass band of the fundamental frequency can be reduced. Thus, insertion losses of the overall composite high frequency component can be reduced.

Furthermore, in this composite high frequency component, the diplexer is formed by the first inductors and the first capacitors, the high frequency switches are formed by the diodes, the second inductors, and the second capacitor, and the high frequency filters are formed by the third inductors and the third capacitors. Some of these constituents are contained in the multi-layer substrate and the remaining constituents are mounted thereon to be connected to each other by connecting sections formed inside the multi-layer substrate. With this arrangement, losses due to wiring between the constituents can be reduced. As a result, losses of the overall composite high frequency component can be reduced.

In addition, since the stripline electrodes which serve as inductors are contained in the multi-layer substrate, wavelength-shortening effects permit the lengths of the stripline electrodes as the inductors to be shortened. As a result, insertion losses of the stripline electrodes can be reduced, thereby achieving miniaturization of the composite high frequency component and reduction in insertion losses thereof. Accordingly, the mobile communication apparatus incorporating the composite high frequency component can be miniaturized, and can also obtain a high level of performance characteristics.

Furthermore, in the modified example shown in FIG. 8, since the surface acoustic wave filters are mounted and sealed in the cavity formed in the multi-layer substrate, bare chips can be used as the surface acoustic wave filters. As a result, the size of the composite high frequency component can be more reduced.

Figure 9:
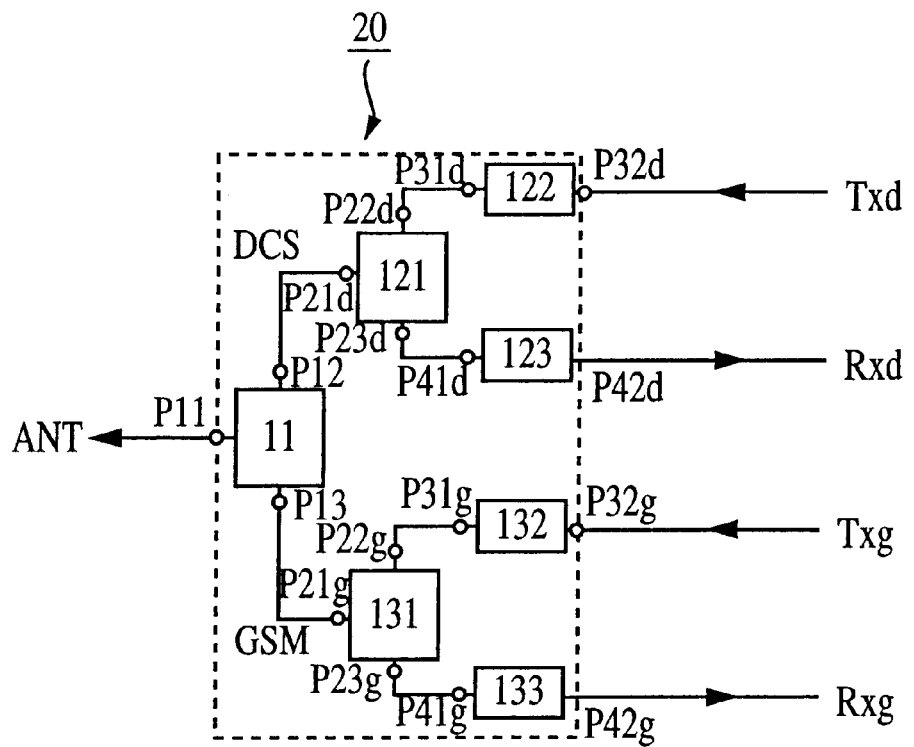
FIG. 9 is a block diagram of a composite high frequency component according to a second embodiment of the present invention.
Figure 10:
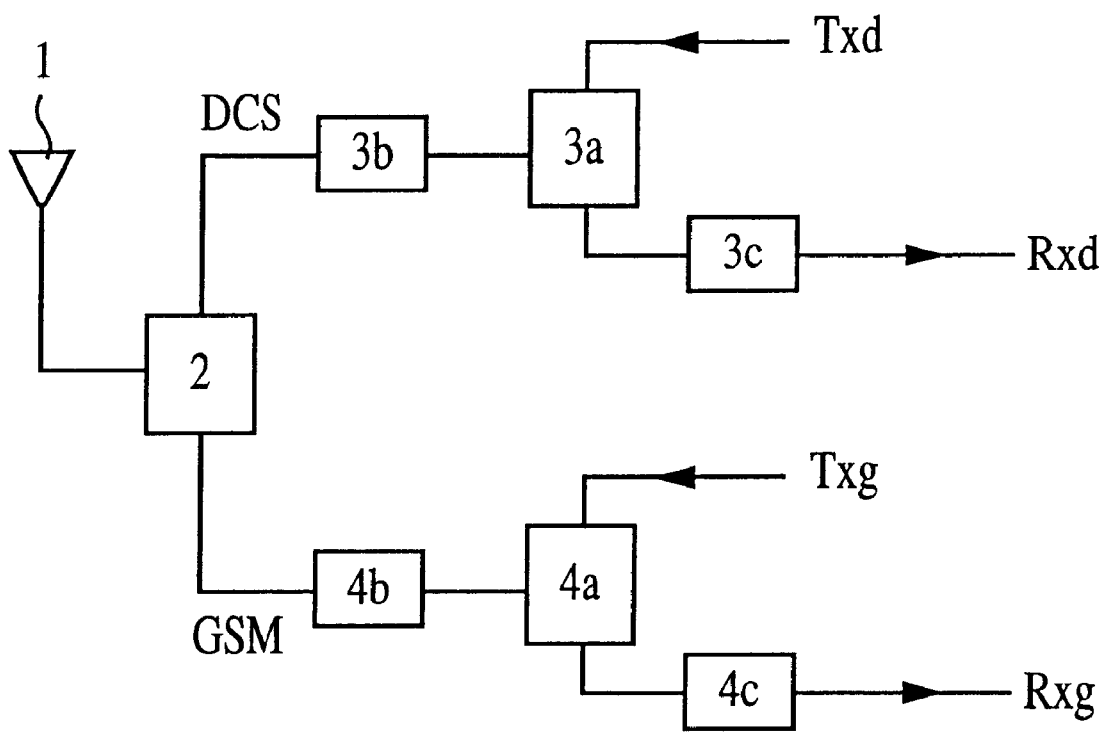
FIG. 10 is a block diagram showing a part of the structure of a conventional dual-band mobile telephone as a mobile communication apparatus.

FIG. 9 shows a block diagram of a composite high frequency component according to a second embodiment of the present invention. In a composite high frequency component 20, unlike the composite high frequency component 10 according to the first embodiment as shown in FIG. 1, the positions for connecting high frequency filters 122 and 132 are changed.

In short, the DCS high frequency filter 122 is connected to a transmission section Txd at the rear of the high frequency switch 121. The GSM high frequency filter 132 is connected to a transmission section Txg at the rear of the high frequency switch 131.

In the composite high frequency component according to the second embodiment described above, since each of the high frequency filters is connected to the transmission section situated at the rear of each of the high frequency switches, when signals are transmitted, distortion of signals due to a high output amplifier in the transmission section can be attenuated by the high frequency filter. As a result, insertion losses in the reception section can be reduced.

In the second embodiment, the composite high frequency component has been used for a combination of the DCS and GSM systems. However, the present invention is not limited to this combination, and can be applied to other combinations, for example, a combination of the Personal Communication Services (PCS) and Advanced Mobile Phone Services (AMPS), a combination of the Digital European Cordless Telephone (DECT) and GSM, and a combination of the Personal Handy-phone System (PHS) and the Personal Digital Cellular (PDC), and the like.

Although the above embodiments have described the cases of signal paths corresponding to two systems, the same advantages can also be obtained in cases of signal paths of three or more systems.

In addition, chip coils can be used as the parallel trap coils and choke coils of the high frequency switches to be mounted on the multi-layer substrate. In this case, since the parallel trap coils and the choke coils are chip coils having high Q factors, chip coils having the same configurations can be used in a plurality of systems having different frequency bands. As a result, modifications of design due to changes of the frequency bands can be easily made, whereby modification of design can be made in a short time. Thus, production cost can be reduced. Moreover, since the parallel trap coils and the choke coils have higher Q factors, the pass band can be broadened and insertion losses can be more reduced.

As described above, in the composite high frequency component, the diplexer, the high frequency switches, the high frequency filters, and the surface acoustic wave filters, which form the composite high frequency component, are integrated in the multi-layer substrate formed by laminating the plurality of ceramic sheet layers. With this arrangement, connections between the diplexer, the high frequency switches, the high frequency filters, and the surface acoustic wave filters, can be established inside the multi-layer substrate.

As a result, matching adjustments can be easily made by known techniques between the diplexer and the high frequency switches, between the high frequency switches and the high frequency filters, between the high frequency switches and the surface acoustic wave filters. Accordingly, there is no need for matching circuits making matching adjustments between these constituents.

Therefore, since the number of constituents can be reduced, the circuit board, on which the microwave circuit having the plurality of signal paths is formed, can be miniaturized.

In the composite high frequency component, since the high frequency-filters are connected to the transmission-section side at the rear of the high frequency switches, distortion of transmitted signals due to the high output amplifier in the transmission section can be attenuated. As a result, insertion losses in the reception section can be reduced.

In addition, since the high frequency filters are notch filters, it can be arranged to attenuate only the signals of frequencies close to the second-order harmonic and the third-order harmonic, which are desired to be attenuated. As a result, influence on the pass band of the fundamental frequency can be reduced. Therefore, as compared with the cases in which signals of the overall harmonic frequency bands are attenuated as in low pass filters and band pass filters, insertion losses in the pass band of the fundamental frequency can be reduced. Accordingly, loss in the overall composite high frequency component can be reduced.

The diplexer included in this composite high frequency component is formed by the first inductance elements and the first capacitance elements, the plurality of high frequency switches is formed by the switching elements, the second inductance elements, and the second capacitance elements, and the plurality of high frequency filters is formed by the third inductance elements and the third capacitance elements. In addition, some of these constituents are contained in the multi-layer substrate and the remaining constituents are mounted thereon to be connected to each other by the connecting sections formed inside the multi-layer substrate. With this arrangement, the composite high frequency component can be constituted by using the single multi-layer substrate, thereby leading to miniaturization of the composite high frequency component. Furthermore, since losses due to wiring between the constituents can be reduced, loss of the overall composite high frequency component can be reduced.

In addition, since some of the stripline electrodes serving as inductors are contained in the multi-layer substrate and the remaining stripline electrodes are mounted thereon, wavelength-shortening effects permit the lengths of the stripline electrodes serving as the inductors to be reduced. Thus, since insertion loss of the stripline electrodes can be reduced, the size and loss of the composite high frequency component can be reduced. As a result, the mobile communication apparatus incorporating the composite high frequency component can be miniaturized, and a high level of performance characteristics can be simultaneously obtained.

Moreover, since the surface acoustic wave filters are mounted and sealed in the cavity formed in the multi-layer substrate, bare chips can be used as the surface acoustic wave filters. As a result, the composite high frequency component can be more miniaturized.

In the mobile communication apparatus according to the present invention, since the compact composite high frequency component having reduced loss is incorporated, the mobile communication apparatus incorporating the composite high frequency component can also be miniaturized and a high level of performance characteristics thereof can be obtained.

While embodiments of the present invention have been described, it will be understood that various modifications and changes may be made therein without departing from the spirit and scope of the invention.

What is claimed is:

1. A composite high frequency component comprising:
   a diplexer which accepts transmitted signals from a plurality of signal paths at a time of transmission, and delivers received signals to the plurality of signal paths at a time or reception;
   a plurality of high frequency switches dividing the plurality of signal paths, respectively, into transmission sections and reception sections;
   a high frequency filter connected in at least one of the signal paths;
   a surface acoustic wave filter connected to a respective one of the reception sections at the rear of the corresponding high frequency switch; and
   a multi-layer substrate comprising a plurality of laminated sheet layers in which the diplexer, the high frequency switches, the high frequency filter, and the surface acoustic wave filter are interconnected, the multi-layer substrate having a top surface and a bottom surface;
   wherein the multi-layer substrate includes a ground electrode formed on one of said sheet layers adjacent to the bottom surface of the multi-layer substrate, and the surface acoustic wave filter is mounted on the top surface of the multi-layer substrate.

2. The composite high frequency component according to claim 1, wherein the composite high frequency component comprises a plurality of high frequency filters including said high frequency filter, and the plurality of high frequency filters are connected in the respective transmission sections at the rear of the corresponding plurality of high frequency switches.

3. The composite high frequency component according to claim 2, wherein the plurality of high frequency filters are notch filters.

4. The composite high frequency component according to claim 1, wherein:
   the diplexer comprises a first inductance element and a first capacitance element;
   each of the plurality of high frequency switches comprises a switching element, a second inductance element, and a second capacitance element;
   the high frequency filter comprises a third inductance element and a third capacitance element; and
   connections are formed inside the multi-layer substrate to connect the surface acoustic wave filter, the switching element, the first to third inductance elements, and the first to third capacitance elements, at least some of which are contained in the multi-layer substrate and at least some of which are mounted thereon.

5. The composite high frequency component according to claim 1, wherein the surface acoustic wave filter is sealed in a cavity formed inside the multi-layer substrate.

6. The composite high frequency component according to claim 1, wherein the high frequency filter comprises a inductance element, a non-grounded capacitance element and a grounded capacitance element.

7. The composite high frequency component according to claim 6, wherein the grounded capacitance element of the high frequency filter is formed between the ground electrode formed on the sheet layer adjacent to the bottom surface of the multi-layer substrate and an electrode which is opposed to the ground electrode.

8. A mobile communication apparatus comprising transmission circuits and reception circuits, a transmission and a reception circuit being connected respectively to the transmission section and the reception section of each of said plurality of signal paths in the composite high frequency component according to claim 1.

9. The mobile communication apparatus according to claim 8, further comprising an antenna connected to said diplexer.

10. A composite high frequency component for being included in a microwave circuit having a plurality of signal paths corresponding to respective frequencies, the composite high frequency component comprising:
    a diplexer which accepts transmitted signals from the plurality of signal paths at a time of transmission, and delivers received signals to the plurality of signal paths at a time of reception;
    a plurality of high frequency switches dividing the plurality of signal paths, respectively, into transmission sections and reception sections;
    a high frequency filter connected in a respective one of the signal paths;
    at least one surface acoustic wave filter connected to a respective one of the reception sections at the rear of the corresponding high frequency switch; and
    a multi-layer substrate comprising a plurality of laminated ceramic sheet layers in which the diplexer, the high frequency switches, the high frequency filter, and the at least one surface acoustic wave filter are interconnected.

11. A composite high frequency component according to claim 10, wherein said high frequency filter is connected between the diplexer and a corresponding one of said plurality of high frequency switches of said signal path.

12. A composite high frequency component according to claim 10, wherein the high frequency filter is connected in the transmission section at the rear of the corresponding high frequency switch.

13. A composite high frequency component according to claim 10, wherein the high frequency filter is a notch filter.

14. A composite high frequency component according to claim 10, wherein:
    the diplexer comprises first inductance elements and first capacitance elements;

each of the plurality of high frequency switches comprises switching elements, second inductance elements, and second capacitance elements;

the high frequency filter comprises a third inductance element and third capacitance elements; and connections are formed inside the multi-layer substrate to connect the at least one surface acoustic wave filter, the switching elements, the first to third inductance elements, and the first to third capacitance elements, at least some of which are contained in the multi-layer substrate and at least some of which are mounted thereon.

15. A composite high frequency component according to claim 10, wherein the at least one surface acoustic wave filter is sealed in a cavity formed inside the multi-layer substrate.

16. A mobile communication apparatus comprising a transmission circuit and a reception circuit, said transmission and reception circuits being connected respectively to the transmission section and the reception section of each of said plurality of signal paths in the composite high frequency component according to claim 10.

17. A mobile communication apparatus according to claim 16, further comprising an antenna connected to said diplexer.

18. A composite high frequency component according to claim 10, wherein the multi-layer substrate includes a ground electrode formed on one of said sheet layers adjacent to the bottom surface of the multi-layer substrate, and the at least one surface acoustic wave filter is mounted on the top surface of the multi-layer substrate.

19. A composite high frequency component according to claim 18, wherein the high frequency filter comprises a inductance element, a non-grounded capacitance element and a grounded capacitance element.

20. A composite high frequency component according to claim 19, wherein the grounded capacitance element of the high frequency filter is formed between the ground electrode formed on the sheet layer adjacent to the bottom surface of the multi-layer substrate and an electrode which is opposed to the ground electrode.

* * * * *